United States Patent [19]

Iwer et al.

[11] 4,250,462

[45] Feb. 10, 1981

[54] COMMON BASE CONNECTED TRANSISTOR AND BIAS NETWORK

[75] Inventors: Herbert W. Iwer, Tempe, Ariz.; Johnnie J. Cochran, Plano, Tex.

[73] Assignee: Motorola, Inc., Schaumburg, Ill.

[21] Appl. No.: 28,956

[22] Filed: Apr. 11, 1979

[51] Int. Cl.³ .............................................. H03F 3/19
[52] U.S. Cl. ..................................... 330/296; 330/306
[58] Field of Search ................ 330/296, 297, 302, 306

[56] References Cited

U.S. PATENT DOCUMENTS 3,991,381  11/1976  Sechi ................................ 330/296 X

*Primary Examiner*—James B. Mullins
*Attorney, Agent, or Firm*—Eugene A. Parsons

[57] ABSTRACT

A transistor with a directly grounded base has an emitter connected through an impedance to ground and also connected through an impedance to a common negative terminal. A bias potential source is connected from the negative terminal through an impedance to ground and a collector potential source is connected from the negative terminal through an impedance to the collector. The floating potential sources allow high collector current without effecting the bias and, therefore, allow high power at relatively high frequencies and broad bandwidth.

11 Claims, 2 Drawing Figures

4,250,462

COMMON BASE CONNECTED TRANSISTOR AND BIAS NETWORK

BACKGROUND OF THE INVENTION

The present invention pertains to common base amplifiers and particularly to the biasing of common base amplifiers for linear operation. In prior art devices the most common method used to bias common base amplifiers is to float the base and bias the circuits similar to that of common emitter circuits. The capacitance added in series with the base circuit by utilizing this method causes additional instabilities and tends to limit the bandwidth in the high power, high frequency devices. If the base is not floated and a negative voltage is applied to the emitter, the bias network must be capable of handling the same current as the collector since the emitter circuit is the device return.

SUMMARY OF THE INVENTION

The present invention pertains to a common base connected transistor wherein the base is connected directly to ground and bias network including a first impedance connected from the emitter to the ground and a second impedance connected from the emitter to a common negative terminal, with a floating bias source connected between the negative terminal and an impedance connected to ground for biasing the transistor into the proper operation and a floating collector potential source connected between the negative terminal and an impedance to the collector for providing the required collector current. The grounded base increases the stability and bandwidth of the circuit while the floating power supplies are separated so that the collector current does not flow through the bias circuit and, therefore, may be relatively high without affecting the bias circuit.

It is an object of the present invention to provide a new and improved common base connected transistor and bias network.

It is a further object of the present invention to provide a new and improved common base connected transistor and bias network wherein the base is connected directly to ground to increase stability and bandwidth and the biasing potential and collector electrode potential are floating and separated so that collector current does not flow through or affect the biasing circuits.

These and other objects of this invention will become apparent to those skilled in the art on consideration of the accompanying specification, claims and drawings.

BRIEF DESCRIPTION OF THE DRAWINGS

Referring to the drawings, wherein like characters indicate like parts throughout the figures.

DESCRIPTION OF THE PREFERRED EMBODIMENT

Figure 1:
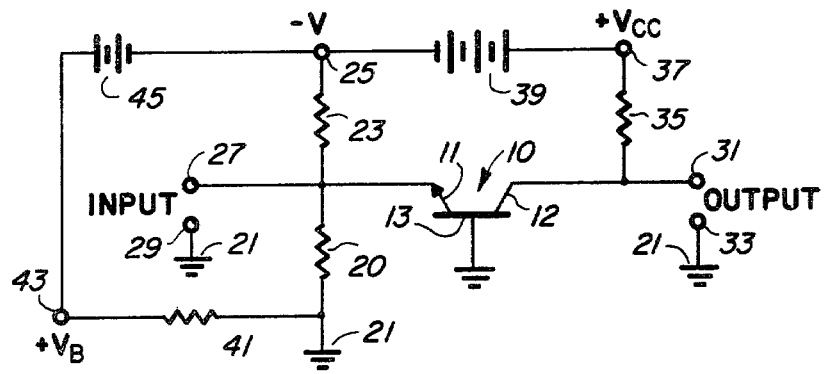
FIG. 1 is a simplified representative schematic diagram of a common base connected transistor and bias network embodying the present invention.

In FIG. 1, the numeral 10 generally designates an N-P-N type transistor having an emitter 11, a collector 12 and a base 13. The emitter 11 is connected through impedance means 20 to a ground 21. The emitter 11 is also connected through a second impedance means 23 to a common negative potential terminal 25. In addition, the emitter 11 serves as the input for the circuit and, accordingly, is connected directly to an input terminal 27. A second input terminal 29 is connected directly to the ground 21 to provide a two terminal input. The collector 12 is connected directly to an output terminal 31, having a companion output terminal 33 connected to the ground 21. The collector 12 is also connected through a third impedance means 35 to a positive potential terminal 37. A collector potential source 39 (illustrated as a simple battery for convenience) is connected between the positive potential terminal 37 and the negative common terminal 25. A fourth impedance means 41 is connected between a positive bias potential terminal 43 and the ground 21. A bias potential source 45 (represented by a simple battery for convenience) is connected between the positive bias terminal 43 and the negative common terminal 25.

In the operation of the circuit, the power supplies 39 and 45 are floating because the DC return is connected to the negative terminal 25 and not to the DC ground 21. The base 13 of the transistor 10 as well as the first impedance means 20 in the bias circuit is returned to DC ground. This connection with a positive bias voltage input at the terminal 43 makes the emitter 11 negative with respect to the base 13. With the circuit connected as illustrated, the collector current, which can be very large for high powered devices, is returned through the second impedance means 23 and has no effect on the bias circuitry. A major advantage of the bias network is that a relatively simple circuit can be connected to bias a common base linear amplifier without the need to float the base. This circuit results in good stability and bandwidth. A further advantage of the circuit is that a low voltage, low current, positive power supply can be used as in common emitter circuits. Generally, the circuit is useful in applications for broadband linear amplifiers above 500 MHz where maximum gain and minimum devices are required. Particularly, common base devices are commonly used above one GHz because of their high gain.

Figure 2:
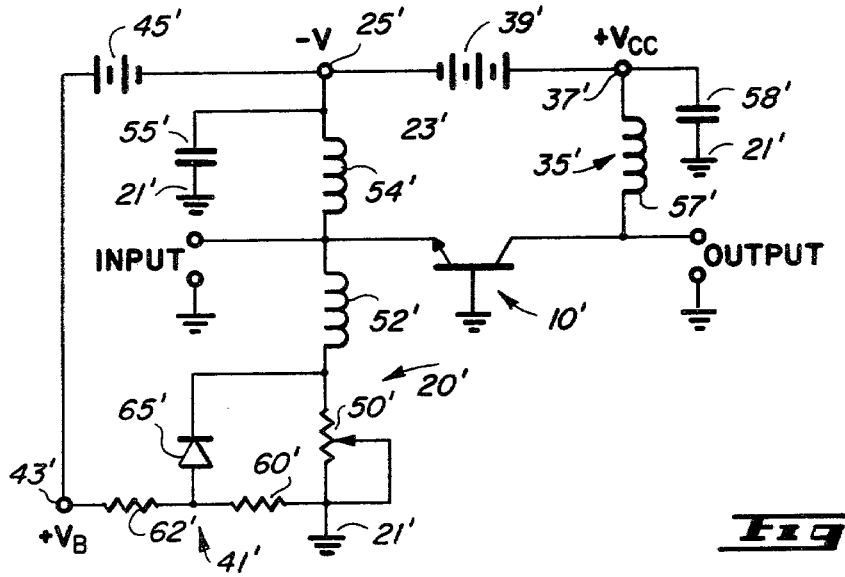
FIG. 2 is a somewhat more complex schematic diagram similar to FIG. 1.

Referring to FIG. 2, a more specific schematic diagram of a common base connected transistor and bias network is illustrated. Similar numbers are used to indicate similar parts and all of the numbers have a prime added to indicate a different embodiment. In this specific circuit, the impedance means 20', 23', 35' and 41' (illustrated in FIG. 1 as simple resistors) are illustrated as more complex impedances which may be utilized in high frequency broad band linear amplifiers. The first impedance means, generally designated 20', includes a variable resistor 50', with a variable contact connected to the ground 21', connected in series with an RF choke 52'. The second impedance means, generally designated 23', includes and RF choke 54' with a bypass capacitor 55' connected from the common negative terminal 25' to ground 21'. The third impedance means, generally designated 35', includes an RF choke 57' and a bypass capacitor 58' connected from the positive potential terminal 37' to ground 21'. The fourth impedance means, generally designated 41', includes a first resistor 60' and a second resistor 62' connected in series between the ground 21' and the positive bias potential terminal 43'. In this embodiment, a diode 65' is connected between the first and fourth impedance means. The anode of the diode is connected to the junction of the resistors 60' and 62' and the cathode is connected to the junction of the variable resistor 50' and the RF choke 52'. The purpose of the diode 65', in part, is to provide a low dynamic resistance source for the base-emitter bias of the transistor 10'. The resistors 50' and 60' act to increase the dynamic resistance and to reduce the effect of temperature variations of the voltage drop of diode 65'. Typical values for the components of the circuit of FIG. 2 are set forth below.

| COMPONENT | VALUE |
|---|---|
| Transistor | |
| 10' | D10-28B |
| Diode | |
| 65' | Bi-Net (Motorola) |
| Resistors | |
| 50' | 20 ohms |
| 60' | Bi-Net (Motorola) |
| 62' | 10 ohms |
| Capacitors | |
| 55' | 5-10 Microfarads |
| 58' | 5-10 Microfarads |
| Chokes | |
| 52' | .2 Microhenry |
| 54' | .2 Microhenry |
| 57' | .2 Microhenry |
| Potential Sources | |
| 39' | 24 volts |
| 45' | 5 volts |

Thus, a new and improved common base connected transistor and bias network is illustrated and described, which circuit is much simpler than prior art circuits and allows for high power operation while maintaining good stability and bandwidth. While an N-P-N type transistor is utilized in the embodyments illustrated, it will be obvious to those skilled in the art that a P-N-P type transistor might be substituted therefor with minor modifications to the circuitry. Further, while we have shown and described specific embodiments of this invention, further modifications and improvements will occur to those skilled in the art. We desire it to be understood, therefore, that this invention is not limited to the particular forms shown and we intend in the appended claims to cover all modifications which do not depart from the spirit and scope of this invention.

We claim:

1. A common base connected transistor and bias network comprising:
    (a) a transistor having base, emitter and collector electrodes with the base electrode being connected directly to a common potential;
    (b) first impedance means connected between and in series with the emitter electrode and the common potential;
    (c) second and third impedance means connected to the emitter and collector electrodes, respectively;
    (d) a first source of potential connected between and in series with said second impedance means and a fourth impedance means connected to the common potential for biasing said transistor into operation;
    (e) a second source of potential connected between and in series with said second and third impedance means for providing a source of collector current; and
    (f) the emitter and collector electrodes being further connected as input and output terminals, respectively.

2. A common base connected transistor and bias network as claimed in claim 1 wherein the transistor is an N-P-N type of transistor.

3. A common base connected transistor and bias network as claimed in claim 1 wherein the first, second and fourth impedance means along with the first source of potential are designed to provide class AB operation.

4. A common base connected transistor and bias network as claimed in claim 1 wherein the transistor and bias network form a relatively broad-band, linear amplifier operating above approximately 500 MHz.

5. A common base connected transistor and bias network as claimed in claim 1 wherein the first impedance means includes a variable resistor connected to provide adjustable bias at the emitter electrode.

6. A common base connected transistor and bias network as claimed in claim 5 wherein the first impedance means further includes an RF choke connected between the variable resistor and the emitter electrode.

7. A common base connected transistor and bias network as claimed in claim 6 wherein the fourth impedance means includes two resistors connected in series.

8. A common base connected transistor and bias network as claimed in claim 7 including in addition diode means connected between the junction of the RF choke and variable resistor and the junction of the two resistors for providing a relatively low dynamic resistance source for the base to emitter electrodes bias.

9. A common base connected transistor and bias network as claimed in claim 8 wherein the second impedance means includes an Rf choke.

10. A common base connected transistor and bias network as claimed in claim 8 wherein the third impedance means includes an RF choke.

11. A common base connected transistor and bias network as claimed in claim 1 wherein diode means are connected between the first and fourth impedance means for providing a relatively low dynamic resistance source for the base to emitter electrodes bias.

* * * * *